(12) United States Patent
Abbott

(10) Patent No.: US 7,723,185 B2
(45) Date of Patent: May 25, 2010

(54) FLASH MEMORY WITH RECESSED FLOATING GATE

(75) Inventor: Todd Abbott, Boise, ID (US)

(73) Assignee: Micron Technology, Inc., Boise, ID (US)

(*) Notice: Subject to any disclaimer, the term of this patent is extended or adjusted under 35 U.S.C. 154(b) by 63 days.

(21) Appl. No.: 12/045,569

(22) Filed: Mar. 10, 2008

(65) Prior Publication Data

US 2008/0153233 A1 Jun. 26, 2008

Related U.S. Application Data

(62) Division of application No. 11/216,970, filed on Aug. 31, 2005, now Pat. No. 7,342,272.

(51) Int. Cl.
*H01L 21/336* (2006.01)

(52) U.S. Cl. .............. 438/259; 438/257; 438/294; 438/270; 257/E21.051; 257/E21.231; 257/E21.267; 257/E21.304; 257/E21.396; 257/E21.435; 257/E21.547; 257/E21.577; 257/E21.585; 257/E21.646

(58) Field of Classification Search ........... 438/197, 438/38, 381, 257, 25, 266, 267, 270, 294, 438/692, 618, 657, 700, 954
See application file for complete search history.

(56) References Cited

U.S. PATENT DOCUMENTS

| 5,146,426 A | 9/1992 | Mukherjee et al. |
| 5,488,244 A | 1/1996 | Quek et al. |
| 5,661,055 A | 8/1997 | Hsu et al. |
| 5,680,345 A | 10/1997 | Hsu et al. |
| 5,744,847 A | 4/1998 | Wen |
| 6,008,079 A * | 12/1999 | Wu .............. 438/175 |
| 6,157,058 A | 12/2000 | Ogura |
| 6,317,360 B1 | 11/2001 | Kanamori |
| 6,417,048 B1 | 7/2002 | Tseng |
| 6,436,765 B1 | 8/2002 | Liou et al. |
| 6,596,588 B2 | 7/2003 | Chou |
| 6,727,168 B2 | 4/2004 | Abbott |
| 6,808,989 B2 | 10/2004 | Hurley et al. |

(Continued)

FOREIGN PATENT DOCUMENTS

CN 101292351 A 10/2008

(Continued)

OTHER PUBLICATIONS

Office Action and Written Opinion dated Sep. 29, 2008, for corresponding EP Application No. 06 802 512.1, filing date Aug. 28, 2006.

(Continued)

*Primary Examiner*—David Nhu
(74) *Attorney, Agent, or Firm*—Knobbe Martens Olson & Bear, LLP

(57) ABSTRACT

A flash memory device where the floating gate of the flash memory is defined by a recessed access device. The use of a recessed access device results in a longer channel length with less loss of device density. The floating gate can also be elevated above the substrate a selected amount so as to achieve a desirable coupling between the substrate, the floating gate and the control gate incorporating the flash cell.

23 Claims, 8 Drawing Sheets

U.S. PATENT DOCUMENTS

| | | |
|---|---|---|
| 6,812,529 B2 | 11/2004 | Trivedi et al. |
| 6,844,255 B2 | 1/2005 | McDaniel et al. |
| 6,851,026 B1 | 2/2005 | Roohparvar |
| 6,862,243 B2 | 3/2005 | Chevallier |
| 6,906,379 B2 | 6/2005 | Chen et al. |
| 6,958,513 B2 | 10/2005 | Wang |
| 7,005,338 B2 | 2/2006 | Ding et al. |
| 7,342,272 B2 | 3/2008 | Abbott |
| 2002/0110984 A1 | 8/2002 | Liou et al. |
| 2002/0177269 A1 | 11/2002 | Chou |
| 2004/0056299 A1 | 3/2004 | Ding et al. |
| 2004/0248371 A1 | 12/2004 | Wang |
| 2005/0045940 A1 | 3/2005 | Chen et al. |
| 2005/0090059 A1 | 4/2005 | Lee et al. |
| 2007/0048935 A1 | 3/2007 | Abbott |
| 2008/0149994 A1 | 6/2008 | Abbott |

FOREIGN PATENT DOCUMENTS

| | | |
|---|---|---|
| WO | WO 2007/027648 | 3/2007 |

OTHER PUBLICATIONS

Search Report dated Nov. 14, 2008, for corresponding ROC (Taiwan) Patent Application No. 095132034, filing date Aug. 30, 2006.
Restriction Requirement dated Mar. 20, 2007 for parent U.S. Appl. No. 11/216,970.
Response to Restriction Requirement dated Mar. 20, 2007 for parent U.S. Appl. No. 11/216,970, filed Apr. 16, 2007.
Office Action dated May 16, 2007 for parent U.S. Appl. No. 11/216,970.
Response to Office Action dated May 16, 2007 for parent U.S. Appl. No. 11/216,970, filed Aug. 16, 2007.
Notice of Allowability dated Aug. 28, 2007 for parent U.S. Appl. No. 11/216,970.
International Search Report for PCT/US2006/033617, filed Aug. 28, 2006.
International Preliminary Report on Patentability for PCT/US2006/033617, filed Aug. 28, 2006.
Office Action for corresponding CN Application No. 200680039369.7, May 8, 2009.
Written Opinion of Corresponding Singapore Pat Appl 200801672-7, Jun. 17, 2009.

* cited by examiner

FLASH MEMORY WITH RECESSED FLOATING GATE

RELATED APPLICATIONS

This application is a divisional of U.S. application Ser. No. 11/216,970, now U.S. Pat. No. 7,342,272, filed Aug. 31, 2005, entitled FLASH MEMORY WITH RECESSED FLOATING GATE, which is hereby incorporated by reference herein. This application is also related to U.S. application Ser. No. 12/045,590, filed Mar. 10, 2008, entitled FLASH MEMORY WITH RECESSED FLOATING GATE, which is a continuation of U.S. application Ser. No. 11/216,970.

BACKGROUND OF THE INVENTION

1. Field of the Invention

The present invention relates to memory devices and, in particular, concerns a flash memory device formed with a recessed gate structure.

2. Description of the Related Art

A wide variety of computer memory devices are now available for use in electrical circuits. A typical computer memory device is a DRAM circuit which offers a high density memory storage device. With all memory devices there is a desire for an increased density of memory devices per chip area. Unfortunately, with increased density of memory devices, the actual physical device dimensions become reduced which causes leakage problems and the like.

One type of memory device which has become quite popular in the past few years is a flash memory device. A flash memory has the advantage of permitting global erasing of all of the cells and also has advantages in terms of processing in that the flash memory generally does not require a capacitor as the storage device. Hence, a higher density of cells can be formed due to fewer component requirements.

The typical flash memory comprises a transistor that has two gate structures. The first gate structure generally comprises a floating gate where charge is stored. The floating gate also functions as a transistor gate forming a conductive path between source/drain regions of the substrate. A control gate is generally positioned adjacent the floating gate but is separated from the floating gate by an insulator. The application of a first voltage on the control gate results in charge tunneling through the dielectric and being stored in the floating gate. When charge is stored in the floating gate, the transistor is non-conductive and when charge is not stored in the floating gate, the transistor can be made conductive, e.g., by application of a pass voltage signal. Hence, the state of charge stored in the floating gate is indicative of the logical state of the flash memory cell.

While flash memory is particularly versatile in many applications and can also be manufactured in a more efficient manner due to the fewer processing steps required, there is still a strong desire to be able to increase the density of flash memory devices. As a consequence, there is an increasing need to be able to make flash memory devices smaller and to do so in such a manner that leakage and other related problems are reduced.

As the lateral dimensions of the flash memory cells decrease, the channel length of the transistor, and notably the select gate, also decreases. With a decreased channel length, leakage currents can occur in the channel and the floating gate behavior can also be altered. Thus, with decreased lateral dimensions, the flash memory can be less reliable.

From the foregoing, it will be apparent that there is an ongoing need for a flash memory design that is smaller in physical size so as to allow for higher density flash memories. To this end, there is a need for a flash memory design which decreases the overall footprint of the individual flash memory cells but does not substantially increase leakage currents occurring within the cell.

SUMMARY OF THE INVENTION

The aforementioned needs are satisfied by the memory device of the present invention which, in one particular implementation, includes a substrate with two source/drain regions formed in the substrate adjacent to the first surface. In this particular implementation, the memory device also includes a recessed access gate that is formed so as to extend into the substrate and so as to be interposed between the two source/drain regions. In this particular implementation, the recessed access device defines a floating gate structure and also induces the formation of a conductive channel between the two source/drain regions that is recessed from the first surface of the substrate. A control gate structure is then formed on the upper surface of the recessed access device. In this particular implementation, the control gate structure and the floating gate structure are formed so as to allow charge to be selectively stored and removed from the floating gate structure to selectively change the state of the conductor channel to thereby provide an indication of the memory state of the flash memory cell.

By having a recessed access gate structure, the overall size of the memory device can be reduced without a significant increase in the leakage current between source/drain regions as the conductive channel is defined by the periphery of the recessed access gate structure. As such, the channel length of the conductive channel is not proportionately reduced by a reduction in the lateral dimensions of the device. In one embodiment, high density flash memory devices can therefore be created without a corresponding consequent decrease in the reliability of the individual flash memory cells.

In another aspect, the present invention comprises a method of forming a memory device in a substrate wherein the method includes the acts of forming a floating gate in a substrate such that the floating gate is capable of storing charge therein and wherein the floating gate extends inward into the substrate and capacitively couples to the substrate such that in the first charge state, a first conductor channel is formed through the substrate about the periphery of the floating gate. The method further comprises the act of positioning a control gate on the floating gate to capacitively couple therewith wherein the application of voltage between the substrate and the control gate allows for a change in the charge state of the floating gate.

By positioning either a recessed access gate or a floating gate structure so as to extend into the substrate to thereby define a channel about the periphery of the substrate, the channel length between the source/drain regions floating gate can be increased without a substantial increase in the overall dimensions of the flash memory cell structure. These and other objects and advantages of the present invention will become more apparent from the following description taken in conjunction with the accompanying drawings.

DETAILED DESCRIPTION OF THE PREFERRED EMBODIMENT

Reference will now be made to the drawings wherein like numerals refer to like parts throughout.

Figure 1A:
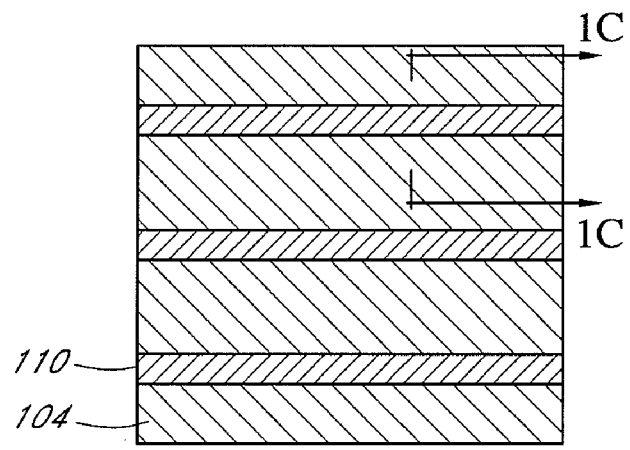
FIGS. 1A-1C are top and cross-sectional views of a semiconductor substrate illustrating the formation of a recessed access gate structure that is to form a floating gate of the flash memory device of a first illustrated embodiment.
Figure 1B:
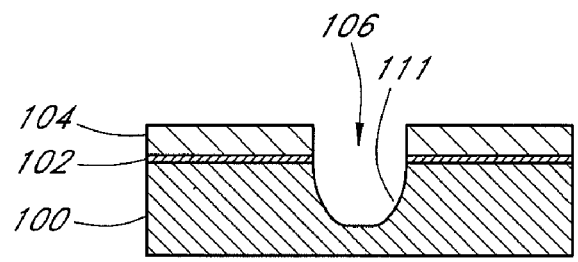
Figure 1C:
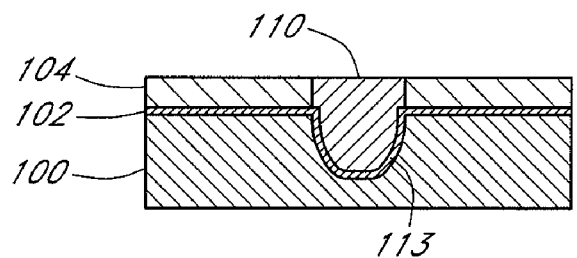

Referring initially to FIGS. 1A-1C, the initial process and steps to form a flash memory with recessed access device is illustrated. In this particular implementation, a pad oxide layer 102 is globally deposited over a semiconductor substrate 100 and then a masking layer, such as a nitride layer 104 is then deposited over the pad oxide 102. In one particular implementation, the pad oxide 102 is formed using a wet oxidation process such that the pad oxide has a thickness of approximately 100 Å and the nitride is deposited using a well-known process to have a thickness of approximately 700 Å.

As is illustrated in FIG. 1B, once the pad oxide 102 and the nitride layer 104 have been globally deposited on an upper surface of the semiconductor substrate 100, an opening or recess 106 is formed, using well known patterning and etching techniques, so as to define the recess 106 within the substrate 100 that is to receive the recessed access device in the manner that will be described below.

In one implementation, the recess 106 extends approximately 400 Å into the substrate 100. Subsequently, a dielectric layer is grown on the interior surface 111 of the recess 106 so as to define a gate oxide 113. In one particular implementation, the gate oxide 113 is formed using a wet oxidation procedure and has a thickness of approximately 80 Å. Subsequently, a conductive material, which in this implementation is polysilicon, is deposited over the gate oxide 113 and the nitride layer 104 so as to fill the recess 106 and to thereby define a polysilicon recessed access gate structure 110 formed within the recess 106. The recessed access gate structure 106 defines a floating gate of the flash memory cell as will be described below. The excess polysilicon material on the nitride layer 104 can be removed from the upper surface of the nitride layer 104 using known etching techniques or chemical mechanical planarization techniques (CMP).

Figure 2A:
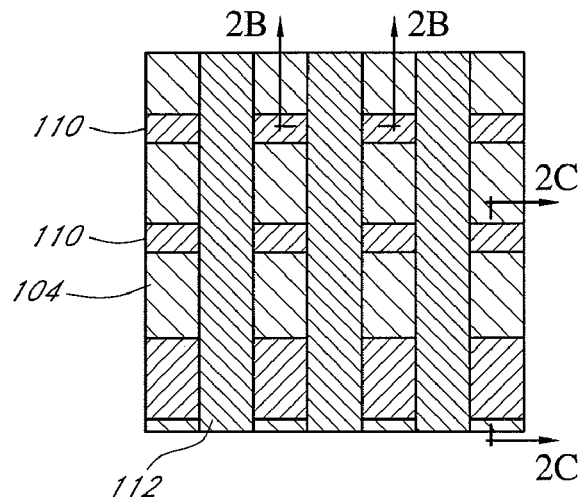
FIGS. 2A and 2B are top and cross-sectional views of the structure of FIG. 1A illustrating the isolation of adjacent recessed access gate structures.
Figure 2B:
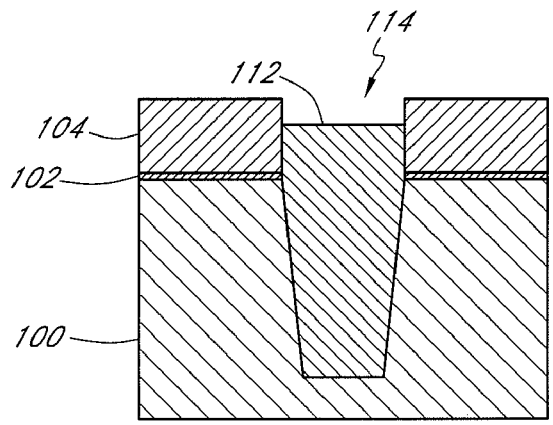

While referring to FIGS. 2A and 2B, isolation structures 112 are formed in the semiconductor substrate 100 so as to isolate adjacent recessed access gate structures 110. Specifically, an isolation opening or trench 114 is formed through the nitride 104, the pad oxide 102, the recessed gate structures and the substrate 100 using well-known patterning and etching techniques. Subsequently, isolation material which, in this implementation, comprises an oxide material, is deposited over the surface of the nitride 104 and the recessed access gate structure 110, which is formed of polysilicon, so as to fill the isolation trench 114 using a high density plasma deposition (HDP) process. Subsequently, the excess isolation material on the nitride and the polysilicon is removed using a CMP process and, as is illustrated in FIG. 2B, the isolation structure 112 is preferably selectively etched back so as to be recessed below the upper surface of the nitride layer 104 and the polysilicon 110.

Figure 2C:
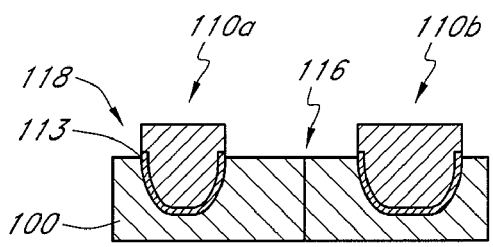
FIGS. 2C and 2D are cross-sectional views that illustrate the formation of a control gate structure on the floating gate structures of the flash memory device of a first illustrated embodiment.
Figure 2D:
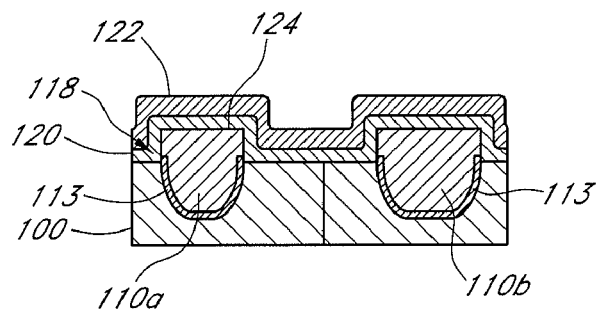

FIGS. 2C and 2D illustrate the subsequent processing of the regions of the substrate 100 that include the recessed access devices 110. As is illustrated in FIG. 2C, the nitride layer 104 and the pad oxide layer 102 surrounding the recessed access device 110 are removed. As is further illustrated in FIG. 2C, this results in a portion 118 of the recessed access gate structures 110 extending upward above an upper surface 116 of the substrate 100. This upward extension allows for greater capacitive coupling between the recessed access gate structure 110, the substrate 100 and the control gate structure as will be described in greater detail below.

After the selective removal of the nitride layer 104 and the pad oxide layer 102, an insulating layer 120 is conformably deposited on the upper surface 116 of the substrate and also over the exposed portion 118 of the recessed gate structure 110 in the manner shown in FIG. 2D. In one preferred embodiment, the insulating layer 120 is comprised of a high K dielectric such as oxygen nitride, oxynitride (ONO), which, in one particular embodiment, is deposited to a thickness of approximately 150 Å.

Subsequent to the deposition of the insulating layer, a thin conductive layer 122 is then conformably deposited over the insulating layer 120. In this particular implementation, the thin conductive layer 122 can comprise a layer of polysilicon that is deposited using well-known techniques to a thickness of approximately 250 Å.

As is illustrated in FIG. 2D, because the insulating layer 120 and the thin conductive layer 122 are conformably deposited over the substrate 100 and the recessed access gate structures 110, the upper portions 118 of the recessed access gate structures 110a, 110b extend vertically upward and inward into a pocket 124 which improves the capacitive coupling between the recessed access gate structure 110a, 110b, and an associated control gate structure in the manner that will be described in greater detail below.

FIGS. 2C and 2D illustrate a pair of recessed access gate structures 110. It will, however, be apparent from the following description that an array of recessed access gate structures 110 can be formed using the above described process and this array can be used to form an array of floating gates for flash memory cells. Typically, for each row of flash memory cells in an array, one gate is usually designated as a select gate that allows for data to either be written to or read from the flash memory devices in the row.

Figure 3A:
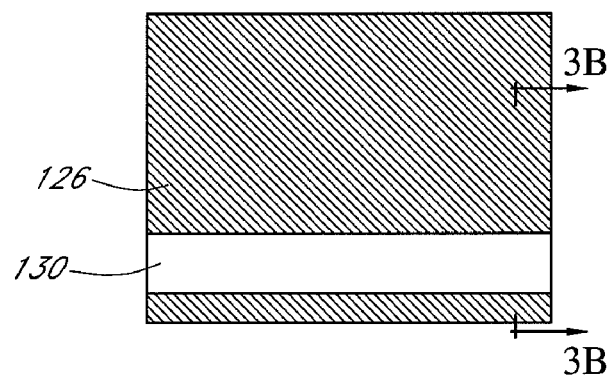
FIGS. 3A-3C are top and cross-sectional views illustrating one exemplary formation of a select gate structure from one of the recessed access devices of the flash memory device of a first illustrated embodiment.
Figure 3B:
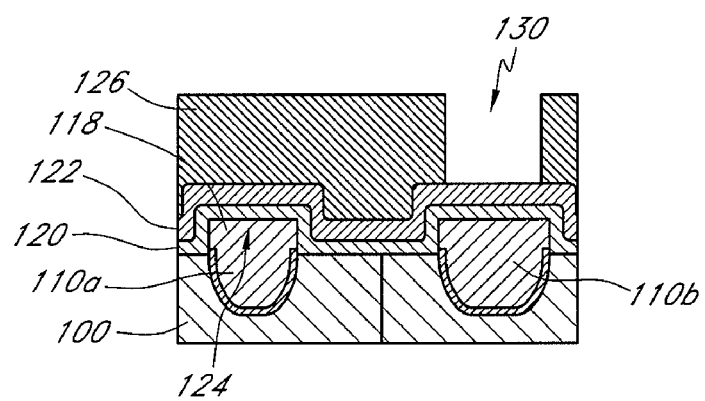
Figure 3C:
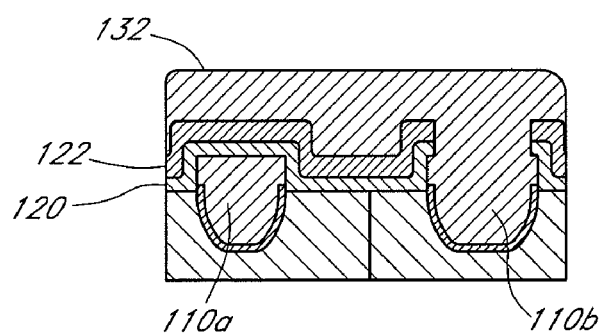

FIGS. 3A-3B illustrate one process whereby one of the recessed access gates 110 can be designated as a select gate and not a floating gate of a flash memory cell. In particular, a photoresist mask layer 126 is globally deposited over the entire substrate 100. The mask 126 is then patterned such that the recessed access gate 110b that is to be defined as the select gate 110b is exposed by an opening 130 in the mask layer 126. The thin conductive layer 122 and the insulating layer 120 are then selectively etched in a known manner so as to expose the polysilicon of the recessed access gate structure 110b. Subsequently, the photoresist material 126 is then removed using a well-known process and a subsequent conductive layer 132 forming a control gate structure, which in this case comprises polysilicon, is deposited over the substrate 100 so as to electrically interconnect with the polysilicon comprising the recessed access gate structure 110b and also the polysilicon previously deposited within conductive layer 122 as shown in FIG. 3C. By removing the insulating layer 120, and directly interconnecting the conductive layer 132 to the conductive material comprising the recessed access gate structure 110b, the recessed access gate structure 110b will therefore not function as a flash memory cell as it will not have a control gate that is electrically isolated from the recessed access gate 110b and can thus be used as an ordinary recessed access transistor in a manner that will be described in greater detail below.

In this implementation, the recessed access gate 110a defines a floating gate of the flash memory. The conductive layer 122 defines the control gate of the flash memory and it is isolated from the floating gate 110a by the insulator layer 120. Hence, when voltage is applied between the control gate and the substrate, charge can be stored in the floating gate thereby creating a conductive channel in the substrate 100. Alternatively, if charge is removed from the floating gate, the conductive channel in the substrate is removed. Hence, the charge state of the floating gate can be sensed in a well-known manner thereby providing an indication of the memory state of the flash cell.

Figure 4A:
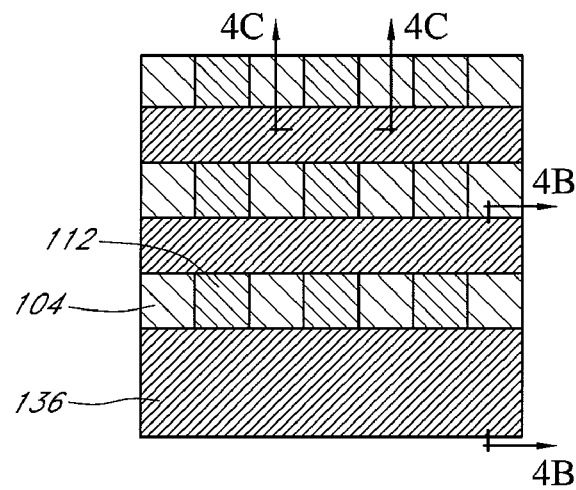
FIGS. 4A-4C are top and cross-sectional views illustrating the formation of word lines in the flash memory device of a first illustrated embodiment.
Figure 4B:
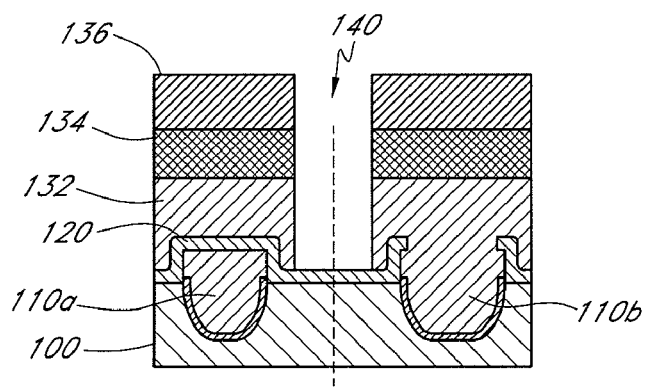
Figure 4C:
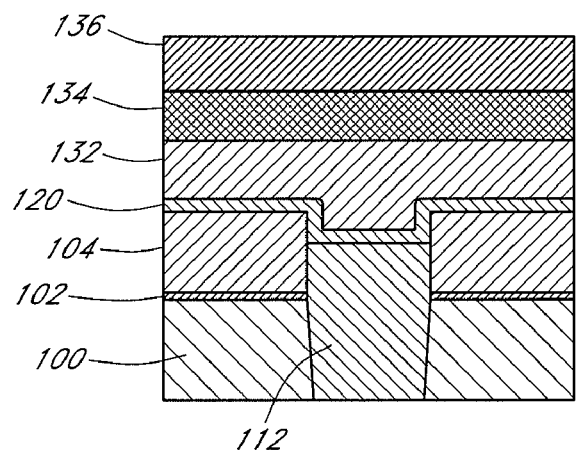

FIGS. 4A-4C illustrate one process whereby the control gate structures of a plurality of flash cells can be interconnected with a conductor. Specifically, as is illustrated in FIGS. 4A-4C, a conductor 134 is preferably deposited so as to overlie the control gate structure 132. In one particular implementation, the conductor 134 is comprised of tungsten silicide (WSiX) and is deposited using well-known deposition techniques to a thickness of approximately 600 Å and may then be patterned and etched using well-known processes. Subsequent to the deposition of the conductive layer 134, an insulator layer 136 is then deposited on the conductor. In one particular implementation, the insulator layer 136 is comprised of a conformably deposited oxide layer such as a tetraethyl orthosilicate (TEOS) layer that is conformably deposited using well-known techniques. The insulator layer 136 and conductive layer 134 and the control gates 132 can then be patterned and etched so as to expose the insulating layer 120 in the upper surface of the substrate 100 to thereby fully isolate the floating gate while forming an array of flash storage nodes.

Figure 5:
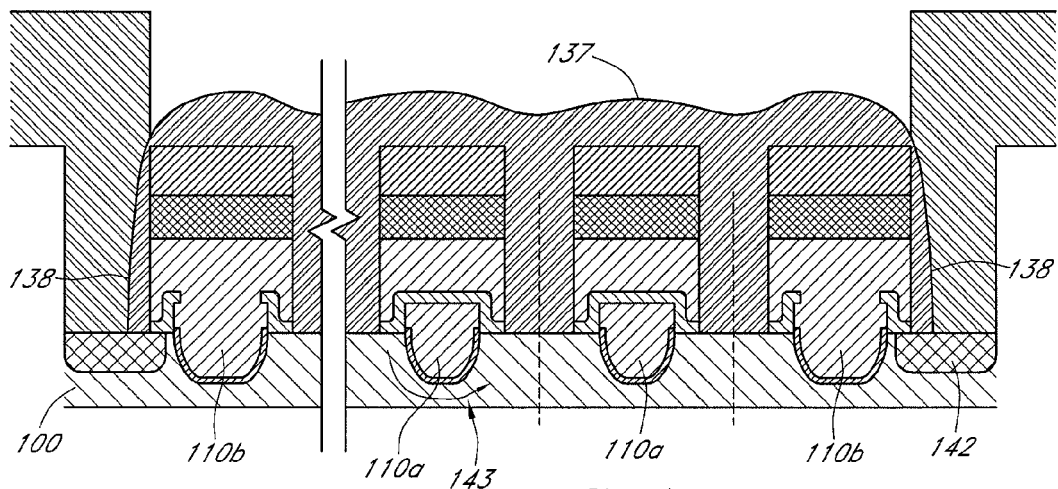
FIG. 5 is a cross-sectional view of one possible flash memory device array of a first illustrated embodiment.
Figure 6A:
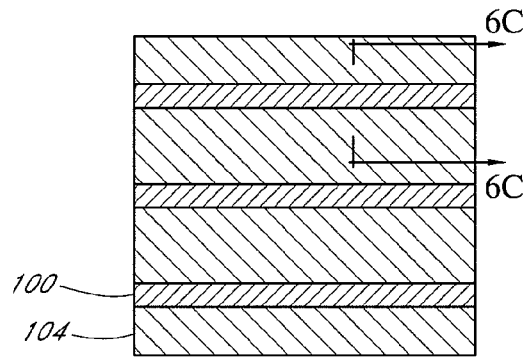
FIGS. 6A-6C are top and cross-sectional views of a semiconductor substrate illustrating the formation of a recessed access gate structure that is to form a floating gate of the flash memory device of a second illustrated embodiment.
Figure 6B:
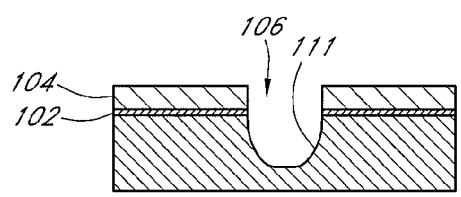
Figure 6C:
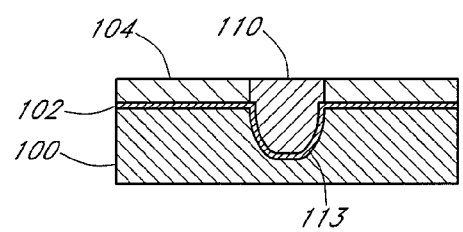

FIG. 5 is one exemplary implementation of a plurality of flash memory devices or cells using recessed access gate structures 110a. A TEOS layer 137 is deposited so as to completely fill the trenches 140 in the array of flash devices. The TEOS layers also form spacers 138 positioned adjacent the select gates 110b after which source/drain regions 142 are implanted in the substrate 100 for blocks of memory devices 110a. In this particular implementation, each of the source/drain regions 142 is formed in the substrate 100 adjacent one of the sides of the select gate structures 110b. The source/drain regions 142 can be formed in a known fashion either before or after formation of the recessed access gate structures 110 described above. The illustration of FIG. 5 is simply exemplary of one possible illustration of a flash memory array using recessed access gate structures 110a, 110b and a person of ordinary skill in the art will appreciate that any of a number of different ways of interconnecting each of the flash memory cells to associated decoder circuitry can be accomplished without departing from the spirit of the present invention.

A flash cell of the illustrated array operates in the following fashion. When a selected voltage is applied between the control gate 132 and the substrate 100, charge can therefore be accumulated on the recessed access floating gate 110a. The accumulation of charge on the recessed access floating gate 110a inhibits the formation of a conductive channel 143 being formed in the substrate 100 about the periphery of the recessed access gate 100a thereby preventing conductivity between one source/drain region 142 to another source/drain region 142. Alternatively, when no charge is on the floating gate 110a, a conductive channel 143 between the two storage nodes 110a can be formed. Hence, when all of the storage nodes 110a are uncharged, there is a conductive channel formed between the two source/drain regions 142.

Thus by selectively applying charge to the floating gates 110a, the conductivity of the channel between the select gates 110b can be altered. In operation, a read voltage is generally applied to one of the gates 110a to ascertain whether the gate is a logical high or low. The remaining gates receive a pass voltage which results in the formation of a channel regardless of the charge state of the other gates. In this way, an individual floating gate 110a can be read to determine its logical state. If charge is stored in the selected floating gate 110a, there is no channel formed between the select gates 110b under the array of floating gates 110a, thereby indicating the storage of a first logical state. If charge is not stored in the selected floating gate 110a, the application of the read voltage will result in the conductive channel being formed thereby indicating the storage of a second logical state in the selected gate 110a.

By using a recessed access device 110a, the conductive channel 143 has an increased length due to the vertical displacement into the substrate 100. Hence, a longer channel length of the channel 143 between the two source/drain regions 142 can be achieved without using as much surface area on the semiconductor substrate 100. The increased channel length thereby reduces the potential of leakage currents occurring between the two source/drain regions 142.

As discussed above, the floating gate structure defined by the recessed access devices 110a extends upwards a preselected distance from the upper surface of the substrate 100 and is positioned within an opening or recess defined by the control gate structure. The height of the extension 118 of the recessed access device 110a above the substrate can be varied so as to modify the capacitive coupling between the floating gate, the substrate and the control gate to affect the ability of the charge to be stored or removed from the floating gate.

FIGS. 6-9 illustrate the various processing steps that can be utilized to form an alternative embodiment of one or more of flash memory cells with an associated select gate. Many of the processing steps described in conjunction with FIGS. 6-9 are the same as the processing steps described in conjunction with the embodiments shown in FIGS. 1-5. In particular, as shown in FIGS. 6A and 6B, a semiconductor substrate 100 is initially covered with a pad oxide 102 and is subsequently covered with a nitride layer 104 that is then selectively removed so as to allow for the formation of the recess 106. The recess 106 is lined with a gate oxide 113 in the previously described manner and the material forming the recessed gate access device 110 can be deposited over the surface of the structure so as to fill the recess 106 so as to define the recessed gate 110 as shown in FIG. 6C. This processing is done in substantially the same manner as described above in connection with FIGS. 1A-1C.

Figure 7A:
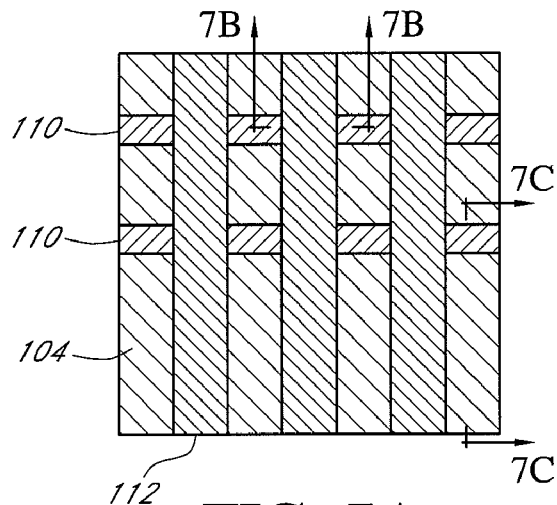
FIGS. 7A and 7B are top and cross-sectional views of the structure of FIG. 6A illustrating the isolation of adjacent recessed access gate structures.
Figure 7B:
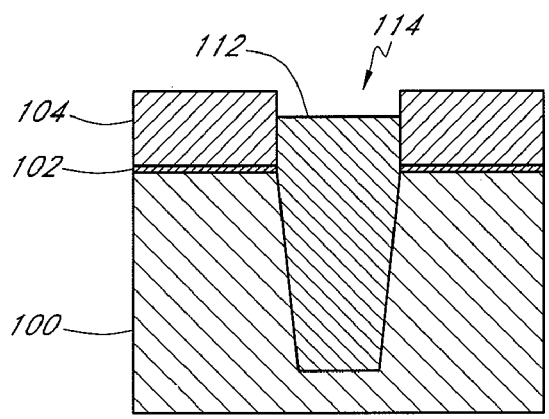
Figure 7C:
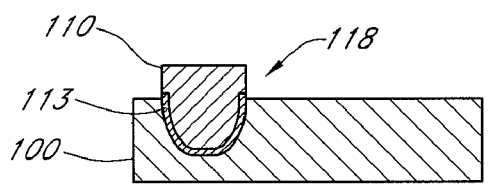
FIGS. 7C and 7D are cross-sectional views illustrating the formation of a control gate and select gate structure of the second illustrated embodiment.

Similarly, FIGS. 7A-7B illustrate the manner in which plurality of isolation structures 112 are formed so as to isolate different recessed access gate structures 110 from each other. In particular, an opening 114 is formed in the substrate 100, the pad oxide 102 and the nitride layer 104 so as to be interposed between adjacent gate structures 110. The isolation opening 114 is then filled with an isolation material in the previously described manner. This results in discreet isolated recessed access gate structures 110 in a manner that is shown in FIG. 7C. As is also shown in FIG. 7C, these recessed access gate structures 110 also incorporate an elevated section 118 which extends above the upper surface of the substrate 100 so as to allow for capacitive coupling between the floating gate, the control gate and the substrate in the manner described above.

Figure 7D:
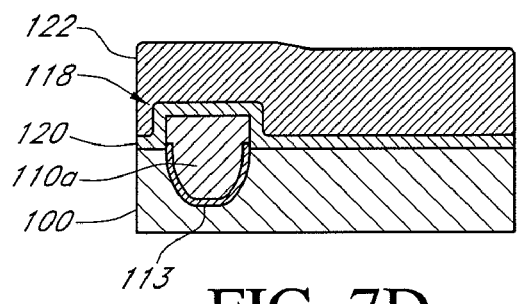

At this point, the processing step of this embodiment differs from the processing step of the embodiment described in conjunction with FIGS. 1 through 5. In particular, in this embodiment, a select gate 152 is formed not using one of the recessed access gates structures 110, rather, the select gate 152 is formed using the insulating layer 120 and the subsequently deposited polysilicon material forming the control gates 132 and the subsequently deposited conductive and insulative material forming the select gate 152. In particular, referring to FIG. 7D, an insulating layer 120 formed, in one implementation of ONO material, is conformably deposited over the recessed access device 110 and the remaining portion of the substrate 100. Subsequently, a conductive layer 122 is then positioned on top of the ONO layer as is illustrated in FIG. 7D.

Figure 8A:
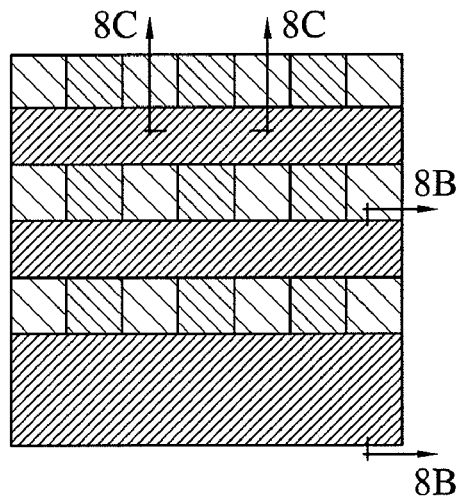
FIGS. 8A-8C are top and cross-sectional views illustrating one exemplary formation of a word-line and select gate structure of the second illustrated embodiment as well as an isolation structure.
Figure 8B:
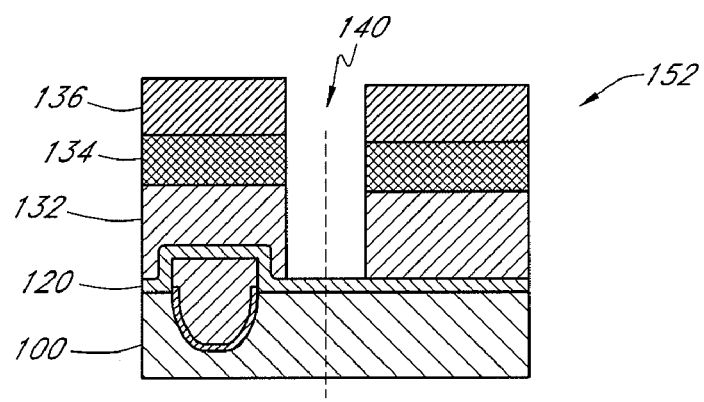
Figure 8C:
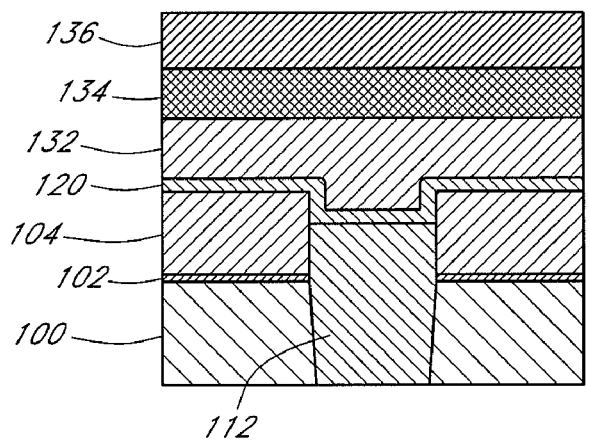

FIGS. 8A-8C illustrate the manner in which the select gate 152 for the flash memory cell 100 is formed as well as how the different embodiment of a select gate 152 can be formed. In particular, the conductive layer 122 is formed in one embodiment of polysilicon that is globally deposited over the surface of the insulating layer 120. Subsequently, a conductive layer 134 of the material such as tungsten silicide (WSiX) can then be deposited on the conductive layer 132. Subsequently, an insulated layer 136 can be deposited on top of the conductive layer 134. The insulated layer 136 can be comprised of TEOS and can be deposited in the same manner as discussed above in connection with the embodiment of FIGS. 1 through 5. Subsequently, the conductive layer 132, the conductor 134, and the insulator layer 136 can be patterned and etched in a well-known manner. The patterning and etching preferably defines a select gate structure 152 that is positioned over the substrate but insulated therefrom by the insulating layer 120. As the conductor layer 134 and the conductive layer 132 can be selectively energized by application of a potential, the structure 152 can function as a typical MOS gate structure of a type known in the art.

Figure 9:
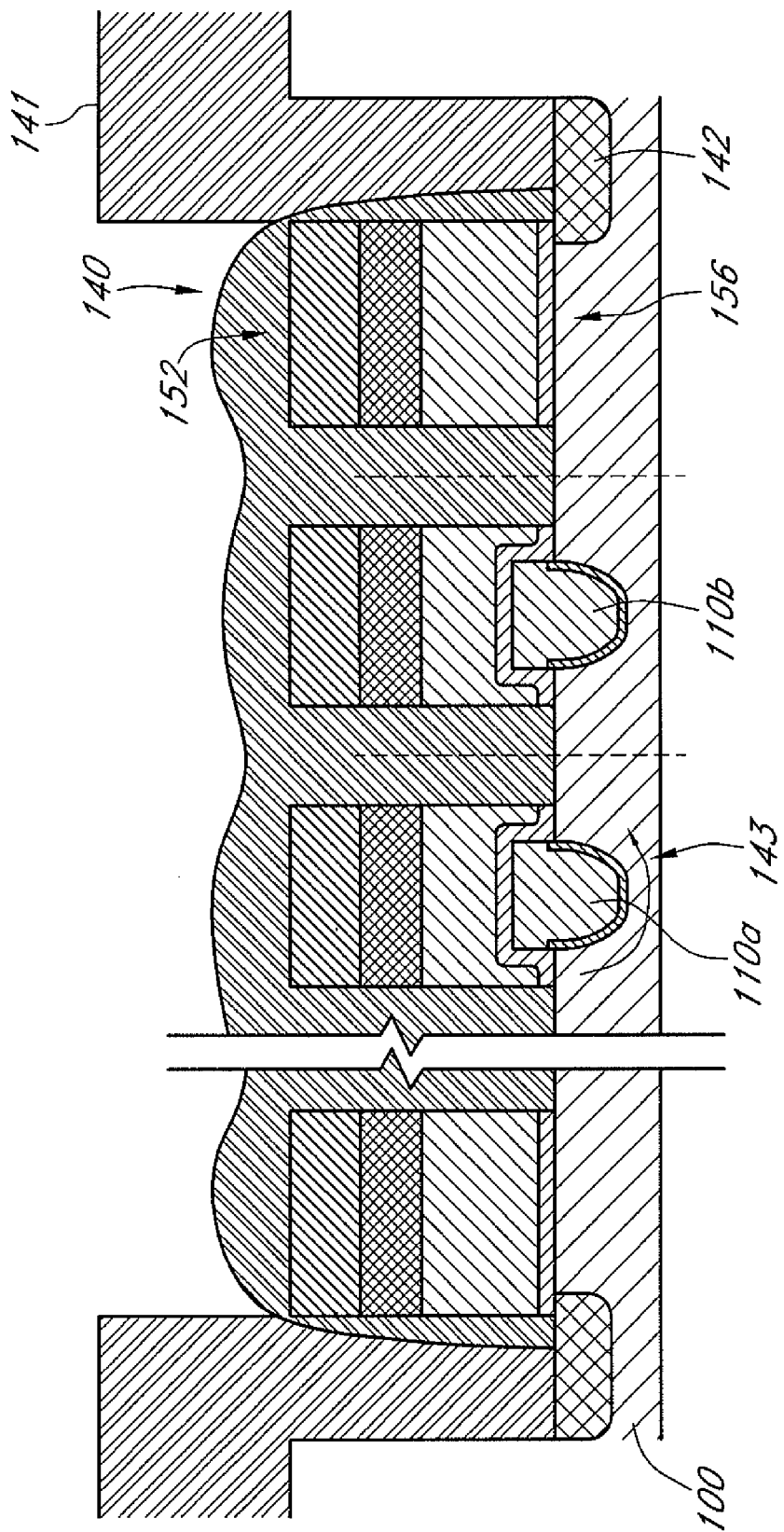
FIG. 9 is a cross-sectional view of one possible flash memory device array of the second illustrated embodiment.

FIG. 9 illustrates one exemplary embodiment in an array of flash memory cells 110 with the MOS select gate structure 152. As shown, the flash memory devices have reduced leakage as a result of the programmed layer being formed in a recessed access device for the same reasons as described above. However, the select gate, instead of being formed out of a recessed access structure, can be formed out of a typical MOS gate structure such that the channel region 156 is positioned immediately under the gate structure 152. As is also shown, various access vias 140 and conductor 141 can be implemented to form word lines and bit lines in a manner known in the art.

Based upon the foregoing, it will be appreciated that the flash memory device and the flash memory array disclosed herein allow for more reliable devices as a result of the floating gate structure of the flash memory being defined by a recessed access gate as this result in less leakage due to the longer channel length of the recessed access device.

Although the above disclosed embodiments of the present invention have shown, described and pointed out the fundamental novel features of the invention as applied to the above disclosed embodiments, it should be understood that various omissions, substitutions and changes in the form and detail of the devices, systems and/or methods illustrated may be made by those skilled in the art without departing from the scope of the present invention. Consequently, the scope of the invention should not be limited to the foregoing description, but should be defined by the appended claims.

What is claimed is:

1. A method of forming a flash memory device, the method comprising:
   forming an opening in a semiconductor substrate wherein the opening extends inward from a first surface of the semiconductor substrate;
   forming a floating gate structure within the opening such that the floating gate structure has a portion recessed below a surface of the semiconductor substrate;
   forming a control gate on the semiconductor substrate so as to be associated with the floating gate structure such that application of a first electrical signal between the control gate and the semiconductor substrate results in charge being stored in the floating gate structure which inhibits the formation of a conductive channel in the semiconductor substrate that is recessed below the surface of the semiconductor substrate and such that application of a second electrical signal between the control gate and the semiconductor substrate results in the removal of charge from the floating gate structure which thereby induces the formation of a conductive channel formed in the semiconductor substrate.

2. The method of claim 1, further comprising forming a pair of source/drain regions adjacent the floating gate structure such that the conductive channel interconnects the source/drain regions via a path that extends about the periphery of the floating gate structure formed in the semiconductor substrate.

3. A method of forming a memory device, the method comprising:
   forming an opening in a semiconductor substrate;
   forming a floating gate structure at least partially within the opening, wherein the floating gate structure has a portion recessed below the surface of the semiconductor substrate; and
   forming a control gate on the semiconductor substrate so as to be associated with the floating gate structure;
   wherein the floating gate structure and the control gate are respectively contoured to achieve a selected level of capacitive coupling therebetween and wherein the control gate defines a recess and the floating gate structure is adapted to extend upwards from the surface of the semiconductor substrate by a selected distance and fit within the recess such that variation of the selected distance modifies the capacitive coupling between the floating gate structure, the semiconductor substrate, and the control gate to affect the ability of charge to be stored or removed from the floating gate structure.

4. The method of claim 3, wherein the control gate comprises a conductive member and an insulator that is interposed between the conductive member of the control gate and the floating gate structure.

5. The method of claim 4, wherein the insulator comprises oxynitride (ONO).

6. A method of forming a memory device, comprising:
  forming two source/drain regions which are coupled to a substrate, adjacent a surface of the substrate;
  forming at least one recess access gate having a first portion which extends beneath the substrate surface into the substrate and a second portion which extends above the substrate surface by a selected distance and so as to be interposed between the two source/drain regions, wherein the at least one recessed access gate defines a conductive channel between the two source/drain regions that is recessed from the surface in the substrate and wherein the at least one recessed access gate has an upper surface proximate the surface of the substrate wherein the at least one recessed access gate defines at least one floating gate structure having an upper surface and wherein variation of the selected distance of the second portion of the recess access gate above the substrate modifies a capacitive coupling between the recess access gate, the substrate, and a control gate structure to thereby affect an ability of a charge to be stored or removed from the floating gate structure; and
  forming at least one control gate structure on the upper surface of the at least one floating gate structure wherein the at least one control gate structure and the at least one floating gate structure are formed so as to allow charge to be selectively stored and removed from the at least one floating gate structure to selectively change a state of the conductive channel to thereby provide an indication of a memory state of the memory device.

7. The method of claim 6, wherein the at least one recessed access gate includes a conductive member and an insulator that is interposed between the conductive member and the substrate.

8. The method of claim 7, wherein the conductive member of the at least one recessed access device is formed of polysilicon and the insulator is formed of a high K dielectric material.

9. The method of claim 6, further comprising forming at least one select gate from at least one of the at least one recess access gate structures.

10. The method of claim 8, further comprising forming a select gate from at least one recess access gate structures, wherein the conductive members of a first plurality of recessed access gate structures are electrically interconnected to the control gate of a second plurality of recessed access gate structures.

11. The method of claim 6, further comprising forming isolation structures within the semiconductor substrate so as to isolate adjacent recessed access gate structures.

12. A method of forming a flash memory device, comprising:
  depositing an oxide layer over a semiconductor substrate;
  depositing a nitride layer upon the oxide layer;
  forming a recess within the oxide layer, the nitride layer, and the semiconductor substrate;
  forming at least one recessed access gate structure within the recess, wherein the recessed access gate structure further defines a floating gate structure of the flash memory device; and
  forming a control gate structure such that, when voltage is applied between the control gate structure and the semiconductor substrate, charge is stored in the floating gate structure, thereby creating a conductive channel in the semiconductor substrate and wherein upon removal of charge from the floating gate structure, the conducive channel in the semiconductor substrate is removed.

13. The method of claim 12, wherein the control gate structure comprises a first conductive layer which is isolated from the floating gate structure by a first insulating layer.

14. The method of claim 12, further comprising forming isolation structures within the semiconductor substrate so as to isolate adjacent recessed access gate structures.

15. The method of claim 14, wherein a plurality of openings are formed through the nitride layer, the oxide layer, the recessed access gate structures, and the semiconductor substrate and wherein the plurality of openings are filled with an oxide material.

16. The method of claim 15, wherein the isolation structures are recessed below an upper surface of the nitride layer and the upper surface of the recessed access gate.

17. The method of claim 12, further comprising removing the nitride layer and oxide layer surrounding the recessed access device so as to result in a portion of the at least one recessed access device extending upward above an upper surface of the semiconductor substrate so as to allow for greater capacitive coupling between the recessed access gate structure, the semiconductor substrate, and the control gate structure.

18. The method of claim 13, further comprising forming a select gate comprising the first insulating layer, a second conductive layer positioned upon the first insulating layer, a third conductive layer positioned upon the second conductive layer, and a second insulating layer positioned upon the third conductive layer.

19. A method of forming a flash memory device, comprising:
  forming a floating gate structure so as to extend into a semiconductor substrate, beneath a surface of the semiconductor substrate; and
  forming a control gate structure adjacent to the surface of the semiconductor substrate so that application of a first voltage between the control gate structure and the semiconductor substrate results in charge being removed from the floating gate structure such that the floating gate structure defines a conductive path that is recessed in the semiconductor substrate about a periphery of the portion of the floating gate structure extending into the semiconductor substrate and so that application of a second voltage between the control gate structure and the semiconductor substrate results in charge being stored in the floating gate structure, changing the conductive channel formed in the semiconductor substrate.

20. The method of claim 19, wherein the floating gate structure comprises a recessed access gate transistor.

21. The method of claim 20, wherein the floating gate structure is capacitively coupled to the control gate and is capacitively coupled to the semiconductor substrate.

22. The method of claim 21, wherein the floating gate structure and the conductive gate structure are respectively contoured to achieve a selected level of capacitive coupling therebetween.

23. The method of claim 22, wherein the control gate structure defines a recess and the floating gate structure is adapted to extend upwards from the upper surface of the semiconductor substrate and to fit within the recess formed in the control gate structure such that an increased level of capacitive coupling proportionate to the first distance between the floating gate structure and the control gate structure occurs

* * * * *

UNITED STATES PATENT AND TRADEMARK OFFICE
CERTIFICATE OF CORRECTION

PATENT NO. : 7,723,185 B2 Page 1 of 1
APPLICATION NO. : 12/045569
DATED : May 25, 2010
INVENTOR(S) : Todd Abbott It is certified that error appears in the above-identified patent and that said Letters Patent is hereby corrected as shown below:

In column 10, line 64, in Claim 23, delete "occurs" and insert -- occurs. --, therefor.

Signed and Sealed this

Twentieth Day of July, 2010

David J. Kappos
*Director of the United States Patent and Trademark Office*